US012775048B2

(12) United States Patent
Choi et al.

(10) Patent No.: US 12,775,048 B2
(45) Date of Patent: Oct. 27, 2026

(54) RELAY DIAGNOSIS APPARATUS AND BATTERY PACK INCLUDING THE SAME

(71) Applicant: LG Energy Solution, Ltd., Seoul (KR)

(72) Inventors: Jang-Hyeok Choi, Daejeon (KR); Min-Woo Kim, Daejeon (KR); Tae-Youn Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 160 days.

(21) Appl. No.: 18/863,397

(22) PCT Filed: Sep. 13, 2023

(86) PCT No.: PCT/KR2023/013757
§ 371 (c)(1),
(2) Date: Nov. 6, 2024

(87) PCT Pub. No.: WO2024/058555
PCT Pub. Date: Mar. 21, 2024

(65) Prior Publication Data

US 2025/0290982 A1 Sep. 18, 2025

(30) Foreign Application Priority Data

Sep. 16, 2022 (KR) ........................ 10-2022-0117098

(51) Int. Cl.
*G01R 31/327* (2006.01)
*G01R 31/392* (2019.01)
*G01R 19/10* (2006.01)

(52) U.S. Cl.
CPC ..... *G01R 31/3278* (2013.01); *G01R 31/3275* (2013.01); *G01R 19/10* (2013.01); *G01R 31/392* (2019.01)

(58) Field of Classification Search
CPC .... G01R 31/00; G01R 31/005; G01R 31/006; G01R 31/327; G01R 31/3271;
(Continued)

(56) References Cited

U.S. PATENT DOCUMENTS 12,298,348 B2 * 5/2025 Kikuchi ............ G01R 31/3278
2007/0139005 A1 6/2007 Osawa
(Continued)

FOREIGN PATENT DOCUMENTS

CN 114019360 B * 10/2024 ........... G01R 31/327
JP 2021-069229 A 4/2021
(Continued)

OTHER PUBLICATIONS

International Search Report for Application No. PCT/KR2023/013757 mailed Dec. 4, 2023. 3 pgs.
(Continued)

*Primary Examiner* — Hoai-An D. Nguyen
(74) *Attorney, Agent, or Firm* — Lerner David LLP

(57) ABSTRACT

A relay diagnosis apparatus for diagnosing a positive electrode relay and a negative electrode relay provided in a battery pack, including a first switch, wherein a first end of the first switch is connected between a positive electrode of a battery and a first end of the positive electrode relay, and a second end of the first switch is connected between a negative electrode of the battery and a first end of the negative electrode relay; a second switch, wherein a first end of the second switch is connected between the positive electrode of the battery and the first end of the positive electrode relay, and a second end of the second switch is connected between a second end of the positive electrode relay and a second end of the negative electrode relay; and a power source unit.

11 Claims, 8 Drawing Sheets

(58) Field of Classification Search
CPC ............ G01R 31/3272; G01R 31/3275; G01R 31/3277; G01R 31/3278; G01R 31/36; G01R 31/385; G01R 31/392; G01R 19/00; G01R 19/10; B60L 3/00; B60L 3/12
USPC .................................................. 324/415, 418
See application file for complete search history.

(56) References Cited

U.S. PATENT DOCUMENTS

| | | | |
|---|---|---|---|
| 2015/0115972 | A1 | 4/2015 | Park |
| 2019/0064280 | A1 | 2/2019 | Sun et al. |
| 2019/0097438 | A1 | 3/2019 | Song et al. |
| 2020/0116791 | A1 | 4/2020 | Song |
| 2020/0142002 | A1 | 5/2020 | Park et al. |
| 2023/0099667 | A1 | 3/2023 | Park |

FOREIGN PATENT DOCUMENTS

| | | | |
|---|---|---|---|
| KR | 2013-0051228 | A | 5/2013 |
| KR | 2014-0061637 | A | 5/2014 |
| KR | 101504274 | B1 | 3/2015 |
| KR | 2015-0047367 | A | 5/2015 |
| KR | 2016-0054935 | A | 5/2016 |
| KR | 2019-0034889 | A | 4/2019 |
| KR | 2019-0051555 | A | 5/2019 |
| KR | 2019-0069889 | A | 6/2019 |
| KR | 102052956 | B1 | 12/2019 |
| KR | 2021-0068895 | A | 6/2021 |
| KR | 2022-0042794 | A | 4/2022 |
| KR | 2022-0049950 | A | 4/2022 |

OTHER PUBLICATIONS

Extended European Search Report including Written Opinion for Application No. 23865851.2 dated Aug. 19, 2025. 5 pages.

* cited by examiner

RELAY DIAGNOSIS APPARATUS AND BATTERY PACK INCLUDING THE SAME

CROSS-REFERENCE TO RELATED APPLICATION

The present application is a national phase entry under 35 U.S.C. § 371 of International Application No. PCT/KR2023/013757 filed Sep. 13, 2023, which claims priority from Korean Patent Application No. 10-2022-0117098 filed on Sep. 16, 2022 in the Republic of Korea, the disclosures of which are incorporated herein by reference.

TECHNICAL FIELD

The present disclosure relates to a relay diagnosis apparatus and a battery pack including the same, and more specifically, to a relay diagnosis apparatus that diagnoses the state of a relay and a battery pack including the same.

BACKGROUND ART

Generally, a battery pack may include a positive electrode relay connected to the positive electrode of the battery and a negative electrode relay connected to the negative electrode of the battery. For example, the positive electrode relay may be connected between the positive electrode of the battery and the positive electrode of the battery pack, and the negative electrode relay may be connected between the negative electrode of the battery and the negative electrode of the battery pack.

If a problem situation such as an inrush current flowing through this relay occurs, the relay may break down. For example, when excessive current flows through the relay, the contact points may melt due to the heat generated, causing the relay to become fused. If the relay is fused, the operation state of the relay cannot be controlled normally, which may cause problems in which the voltage of the battery pack cannot be blocked. Therefore, technology to diagnose the state of the relay provided in the battery pack may be considered important for safety.

FIG. 1 is a diagram schematically showing an exemplary configuration of a conventional battery pack.

Referring to FIG. 1, the battery pack may include a battery BAT, a positive electrode relay PR, and a negative electrode relay NR. Additionally, the battery pack may include a first switch SW1, a second switch SW2, a third switch SW3, and a fourth switch SW4.

Hereinafter, the node between the positive electrode of the battery BAT and the positive electrode relay PR is referred to as an A node, and the node between the positive electrode relay PR and the positive electrode terminal P+ of the battery pack is referred to as a B node. The node between the negative electrode of the battery BAT and the negative electrode relay NR is referred to as a G node, and the node between the negative electrode relay NR and the negative electrode terminal P− of the battery pack is referred to as a H node.

The state of the positive electrode relay PR may be diagnosed based on the voltage difference between the A node and the B node. The voltage corresponding to the A node may be measured at the ADC_A point, and the voltage corresponding to the B node may be measured at the ADC_B point. Also, the state of the positive electrode relay PR may be diagnosed according to the difference between the measured voltages. Here, in order to measure the voltage at the ADC_A point and the ADC_B point, the first switch SW1 and the second switch SW2 and a plurality of resistors are required.

Likewise, the state of the negative electrode relay NR may be diagnosed based on the voltage difference between the G node and the H node. The voltage corresponding to the G node is the ground voltage of the battery pack, and the voltage corresponding to the H node may be measured at the ADC_H point. Also, the state of the negative electrode relay NR may be diagnosed according to the difference between the ground voltage and the measured voltage. Here, in order to measure the voltage at the ADC_H point, the third switch SW3 and the fourth switch SW4 and a plurality of resistors are required.

In other words, the conventional battery pack has the problem of requiring a plurality of switches SW1, SW2, SW3, SW4 to diagnose the state of the relays PR, NR. Therefore, a compact diagnostic circuit is required to diagnose the state of the relay of the battery pack, and cost reduction may be expected through this.

SUMMARY

Technical Problem

The present disclosure is designed to solve the problems of the related art, and therefore the present disclosure is directed to providing a relay diagnosis apparatus capable of diagnosing a state of a relay of a battery pack, and a battery pack including the same.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A relay diagnosis apparatus according to one aspect of the present disclosure may diagnose a positive electrode relay and a negative electrode relay provided in a battery pack.

The relay diagnosis apparatus may comprise a first switch, wherein a first end of the first switch is connected between a positive electrode of a battery and a first end of the positive electrode relay, and a second end of the first switch is connected between a negative electrode of the battery and a first end of the negative electrode relay; a second switch, wherein a first end of the second switch is connected between the positive electrode of the battery and the first end of the positive electrode relay, and a second end of the second switch is connected between a second end of the positive electrode relay and a second end of the negative electrode relay; and a power source unit, wherein a first end of the power source unit is connected between the negative electrode of the battery and the first end of the negative electrode relay, and a second end of the power source unit is connected between the second end of the second switch and the second end of the negative electrode relay.

The relay diagnosis apparatus according to another aspect of the present disclosure may further comprise a first resistor located between the positive electrode of the battery and the first end of the first switch, wherein a first end of the first resistor is connected to the positive electrode of the battery and a second end of the first resistor is connected to the first end of the first switch; and a second resistor located between the negative electrode of the battery and the second end of the first switch, wherein a first end of the second resistor is connected to the second end of the first switch and a second end of the second resistor is connected to the negative electrode of the battery.

The relay diagnosis apparatus according to still another aspect of the present disclosure may further comprise a third resistor located between the second end of the second switch and the second end of the positive electrode relay, wherein a first end of the third resistor is connected to the second end of the second switch and a second end of the third resistor is connected between the second end of the positive electrode relay and the second end of the power source unit; and a fourth resistor, wherein a first end of the fourth resistor is connected between the second end of the second switch and the first end of the third resistor, and a second end of the fourth resistor is connected between the second end of the power source unit and the second end of the negative electrode relay.

The relay diagnosis apparatus according to still another aspect of the present disclosure may further comprise a fifth resistor located between the second end of the third resistor and the second end of the power source unit, wherein a first end of the fifth resistor is connected between the second end of the third resistor and the second end of the positive electrode relay; and a sixth resistor located between the second end of the third resistor and the second end of the power source unit, wherein a first end of the sixth resistor is connected to the second end of the fifth resistor and the second end of the sixth resistor is connected to the second end of the power source unit.

The relay diagnosis apparatus according to still another aspect of the present disclosure may further comprise a seventh resistor located between the second end of the power source unit and the second end of the fourth resistor, wherein a first end of the seventh resistor is connected to the second end of the power source unit; and an eighth resistor located between the second end of the power source unit and the second end of the fourth resistor, wherein a first end of the eighth resistor is connected to the second end of the seventh resistor and the second end of the eighth resistor is connected to the second end of the fourth resistor.

The relay diagnosis apparatus according to still another aspect of the present disclosure may further comprise a processor configured to measure a first voltage of the second end of the first switch, measure a second voltage between the second switch and the second end of the power source unit, and measure a third voltage between the second end of the power source unit and the second end of the negative electrode relay.

The processor may be configured to calculate a first voltage difference between the first voltage and the second voltage and diagnose a state of the positive electrode relay based on the calculated voltage difference.

The processor may be configured to calculate a second voltage difference between the third voltage and a ground voltage and diagnose a state of the negative electrode relay based on the calculated voltage difference.

The processor may be configured to measure the first voltage and the second voltage when the positive electrode relay, the negative electrode relay, and the second switch are in a turn-off state, and the first switch is in a turn-on state.

The processor may be configured to measure the third voltage when the positive electrode relay, the negative electrode relay, the first switch, and the second switch are in a turn-off state.

A battery pack according to still another aspect of the present disclosure may comprise the relay diagnosis apparatus according to one aspect of the present disclosure.

Advantageous Effects

According to one aspect of the present disclosure, the relay diagnosis apparatus has the advantage of dramatically reducing production costs because it has a compact and simplified structure.

In addition, according to another aspect of the present disclosure, because the relay diagnosis apparatus includes fewer switches for diagnosing the state of the relay compared to the prior art, the possibility of misdiagnosis due to a failure of the switch itself can be reduced.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as “first”, “second” and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 2:
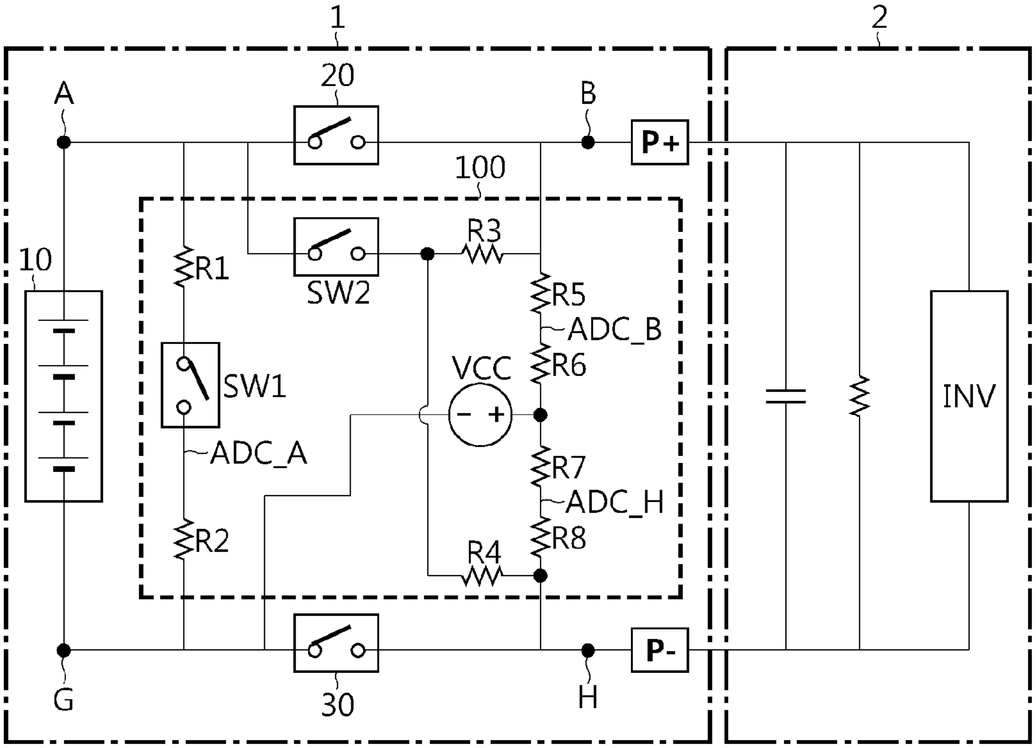
FIG. 2 is a diagram schematically showing an exemplary configuration of a battery pack according to an embodiment of the present disclosure.

FIG. 2 is a diagram schematically showing an exemplary configuration of a battery pack 1 according to an embodiment of the present disclosure.

Referring to FIG. 2, the battery pack 1 may include a battery 10, a positive electrode relay 20, and a negative electrode relay 30. Specifically, the positive electrode of the battery 10 may be connected to one end of the positive electrode relay 20. Also, the other end of the positive electrode relay 20 may be connected to the positive electrode terminal P+ of the battery pack 1. The negative electrode of the battery 10 may be connected to one end of the negative electrode relay 30. Also, the other end of the negative electrode relay 30 may be connected to the negative electrode terminal P− of the battery pack 1.

In addition, although not shown in FIG. 2, the battery pack 1 may further include electrical components (relay, fuse, etc.) and a case.

Here, the battery 10 refers to an independent cell that has a negative electrode terminal and a positive electrode terminal and is physically separable. As an example, a lithium-ion battery or a lithium polymer battery may be considered as the battery 10. Additionally, the battery 10 may mean a battery 10 module in which a plurality of cells are connected in series and/or parallel. For example, in the embodiment of FIG. 2, the battery 10 may be a battery 10 module including a plurality of battery 10 cells.

One end of the load 2 may be connected to the positive electrode terminal P+ of the battery pack 1, and the other end may be connected to the negative electrode terminal P− of the battery pack 1. Accordingly, the positive electrode terminal of the battery 10, the positive electrode terminal P+ of the battery pack 1, the load 2, the negative electrode terminal P− of the battery pack 1, and the negative electrode terminal of the battery 10 may be electrically connected.

For example, the load 2 may be a charging/discharging device, or a motor, etc. of an electric vehicle supplied with power from the battery 10. In the embodiment of FIG. 2, the load 2 may be a motor of an electric vehicle including an inverter.

The relay diagnosis apparatus 100 according to an embodiment of the present disclosure may be configured to diagnose the positive electrode relay 20 and the negative electrode relay 30 provided in the battery pack 1. Specifically, the relay diagnosis apparatus 100 may diagnose the states of the positive electrode relay 20 and the negative electrode relay 30. For example, the relay diagnosis apparatus 100 may determine whether the positive electrode relay 20 and the negative electrode relay 30 are in a fused state.

Referring to FIG. 2, the relay diagnosis apparatus 100 may include a first switch SW1, a second switch SW2, and a power source unit VCC.

The first switch SW1 may be configured such that one end is connected between the positive electrode of battery 10 and one end of the positive electrode relay 20, and the other end is connected between the negative electrode of the battery 10 and one end of the negative electrode relay 30.

Specifically, the first switch SW1 may be connected in parallel with the battery 10. For example, in the embodiment of FIG. 2, one end of the first switch SW1 may be connected to the A node, and the other end of the first switch SW1 may be connected to the G node.

The second switch SW2 may be configured such that one end is connected between the positive electrode of battery 10 and one end of the positive electrode relay 20, and the other end is connected between the other end of the positive electrode relay 20 and the other end of the negative electrode relay 30.

Specifically, the other end of the second switch SW2 may be connected between the other end of the positive electrode relay 20 and the positive electrode terminal P+ of the battery pack 1. Additionally, the other end of the second switch SW2 may also be connected between the other end of the negative electrode relay 30 and the negative electrode terminal P− of the battery pack 1. Therefore, the other end of the second switch SW2 may be connected between the other end of the positive electrode relay 20 and the other end of the negative electrode relay 30.

For example, in the embodiment of FIG. 2, one end of the second switch SW2 may be connected to the A node, and the other end of the second switch SW2 may be connected to the B node. Additionally, the other end of the second switch SW2 may also be connected to the H node. That is, the line connected to the other end of the second switch SW2 may be branched, one branch line may be connected to the B node, and the remaining branch line may be connected to the H node.

The power source unit VCC may be configured such that one end is connected between the negative electrode of the battery 10 and one end of the negative electrode relay 30, and the other end is connected between the other end of the second switch SW2 and the other end of the negative electrode relay 30.

Here, the power source unit VCC is a configuration that can supply a predetermined power, and one end of the power source unit VCC may be a − pole, and the other end of the power source unit VCC may be a + pole.

Specifically, the other end of the power source unit VCC may be connected to a branch line connecting the other end of the second switch SW2 and the other end of the negative electrode relay 30. The other end of the power source unit VCC may be connected to the other end of the second switch SW2. Additionally, the other end of the power source unit VCC may also be connected between the other end of the positive electrode relay 20 and the positive electrode terminal P+ of the battery pack 1. Additionally, the other end of the power source unit VCC may also be connected between the other end of the negative electrode relay 30 and the negative electrode terminal P− of the battery pack 1. That is, one end of negative electrode relay 30, one end of power source unit VCC, the other end of the power source unit VCC and the other end of the negative electrode relay 30 may form a closed circuit.

For example, in the embodiment of FIG. 2, one end of the power source unit VCC may be connected to the G node, and the other end of the power source unit VCC may be connected to the B node and the H node.

Referring to FIG. 2, the first voltage corresponding to the A node may be measured at the ADC_A point. The second voltage corresponding to the B node may be measured at the ADC_B point. The third voltage corresponding to the H node may be measured at the ADC_H point. The voltage corresponding to the G node may be the ground voltage of the battery pack 1.

Figure 1:
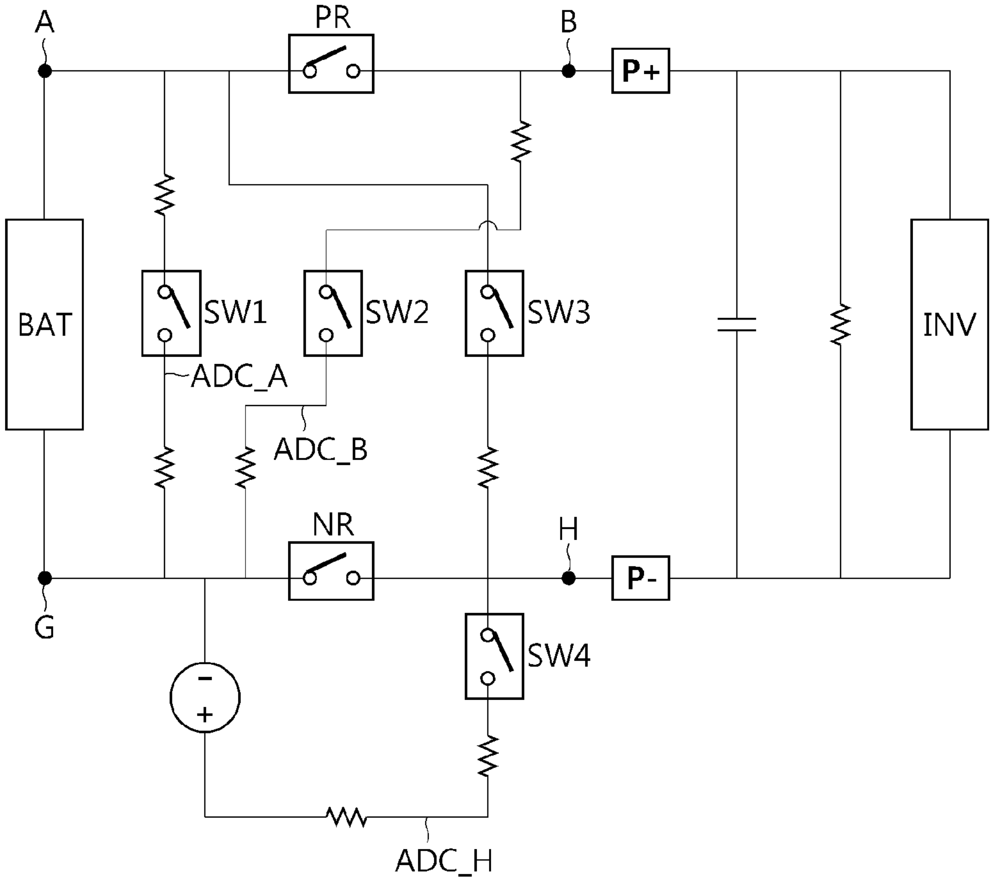
FIG. 1 is a diagram schematically showing an exemplary configuration of a conventional battery pack.

That is, referring to FIGS. 1 and 2, according to the relay diagnosis apparatus 100 in the present disclosure, the number of switches for measuring voltages corresponding to the B node and H node may be dramatically reduced.

Therefore, because the relay diagnosis apparatus 100 has a compact and simplified structure, it has the advantage of dramatically reducing production costs. Additionally, because the relay diagnosis apparatus 100 includes fewer switches for diagnosing the state of the relay (positive electrode relay 20 and negative electrode relay 30) compared to the prior art, the possibility of misdiagnosis due to failure of the switch itself may be reduced.

For example, referring to FIG. 1, if any one of the plurality of switches SW1, SW2, SW3, SW4 fails, the state of the relays PR, NR may be incorrectly diagnosed. That is, conventionally, the number of switches that must be maintained in a normal state for diagnosis of the relays PR, NR was unnecessarily large. On the other hand, referring to FIG. 2, the relay diagnosis apparatus 100 includes a minimum number of switches SW1, SW2 for diagnosing the relays 20, 30, so it is possible to reduce production costs and dramatically reduce the possibility of misdiagnosis on the state of the relays 20, 30.

According to an embodiment of the present disclosure, the relay diagnosis apparatus 100 may further include a first resistor R1 and a second resistor R2.

The first resistor R1 may be configured to be located between the positive electrode of the battery 10 and one end of the first switch SW1. Specifically, the first resistor R1 may be configured so that one end is connected to the positive electrode of the battery 10, and the other end is connected to one end of the first switch SW1.

For example, in the embodiment of FIG. 2, one end of the first resistor R1 may be connected between the positive electrode of the battery 10 and one end of the positive electrode relay 20. Also, the other end of the first resistor R1 may be connected to one end of the first switch SW1.

The second resistor R2 may be configured to be located between the negative electrode of the battery 10 and the other end of the first switch SW1. Specifically, the second resistor R2 may be configured such that one end is connected to the other end of the first switch SW1 and the other end is connected to the negative electrode of the battery 10.

For example, in the embodiment of FIG. 2, one end of the second resistor R2 may be connected to the other end of the first switch SW1. Also, the other end of the second resistor R2 may be connected to the negative electrode of the battery 10 and one end of the negative electrode relay 30.

That is, one end of the first resistor R1 may be connected to the A node, and the other end of the second resistor R2 may be connected to the G node. Therefore, the battery 10, the first resistor R1, the first switch SW1, and the second resistor R2 may form a closed circuit. Also, at the ADC_A point between the first switch SW1 and the second resistor R2, the first voltage corresponding to the A node may be measured.

According to an embodiment of the present disclosure, the relay diagnosis apparatus 100 may further include a third resistor R3 and a fourth resistor R4.

The third resistor R3 may be configured to be located between the other end of the second switch SW2 and the other end of the positive electrode relay 20. Specifically, the third resistor R3 may be configured so that one end is connected to the other end of the second switch SW2, and the other end is connected between the other end of the positive electrode relay 20 and the other end of the power source unit VCC.

For example, in the embodiment of FIG. 2, one end of the third resistor R3 may be connected to the other end of the second switch SW2. Also, the other end of the third resistor R3 may be connected between the other end of the positive electrode relay 20 and the other end of the power source unit VCC. That is, the positive electrode relay 20, the third resistor R3, and the second switch SW2 may form a closed circuit.

The fourth resistor R4 may be configured such that one end is connected between the other end of the second switch SW2 and one end of the third resistor R3, and the other end is connected between the other end of the power source unit VCC and the other end of the negative electrode relay 30.

For example, in the embodiment of FIG. 2, the fourth resistor R4 may be connected between the node between the second switch SW2 and the third resistor R3 and the H node. In other words, one end of the fourth resistor R4 may be connected between the other end of the second switch SW2 and one end of the third resistor R3. Also, the other end of the fourth resistor R4 may be connected between the other end of the power source unit VCC and the other end of the negative electrode relay 30.

According to an embodiment of the present disclosure, the relay diagnosis apparatus 100 may further include a fifth resistor R5 and a sixth resistor R6.

The fifth resistor R5 may be configured to be located between the other end of the third resistor R3 and the other end of the power source unit VCC. Specifically, the fifth resistor R5 may be configured such that one end is connected between the other end of the third resistor R3 and the other end of the positive electrode relay 20.

For example, in the embodiment of FIG. 2, the fifth resistor R5 may be located between the other end of the second switch SW2 and the other end of the power source unit VCC. Preferably, the fifth resistor R5 may be located between the other end of the third resistor R3 and the other end of the power source unit VCC.

One end of the fifth resistor R5 may be connected to the other end of the third resistor R3 and the other end of the positive electrode relay 20. That is, one end of the fifth resistor R5 may be connected between the other end of the third resistor R3 and the other end of the positive electrode relay 20. Also, the other end of the fifth resistor R5 may be connected to one end of the sixth resistor R6.

The sixth resistor R6 may be configured to be located between the other end of the third resistor R3 and the other end of the power source unit VCC. Specifically, the sixth resistor R6 may be configured such that one end is connected to the other end of the fifth resistor R5, and the other end is connected to the other end of the power source unit VCC.

For example, in the embodiment of FIG. 2, the sixth resistor R6 may be located between the other end of the fifth resistor R5 and the other end of the power source unit VCC. One end of the sixth resistor R6 may be connected to the other end of the fifth resistor R5. Also, the other end of the sixth resistor R6 may be connected to the other end of the power source unit VCC.

In addition, at the ADC_B point between the fifth resistor R5 and the sixth resistor R6, the second voltage corresponding to the B node may be measured.

According to an embodiment of the present disclosure, the relay diagnosis apparatus 100 may further include a seventh resistor R7 and an eighth resistor R8.

The seventh resistor R7 may be configured to be located between the other end of the power source unit VCC and the other end of the fourth resistor R4. Specifically, the seventh resistor R7 may be configured so that one end is connected to the other end of the power source unit VCC.

For example, in the embodiment of FIG. 2, the seventh resistor R7 may be located between the other end of the power source unit VCC and the other end of the negative electrode relay 30. Preferably, the seventh resistor R7 may be located between the other end of the power source unit VCC and the other end of the fourth resistor R4.

One end of the seventh resistor R7 may be connected to the other end of the power source unit VCC. That is, one end of the seventh resistor R7 may be connected between the other end of the power source unit VCC and the other end of the sixth resistor R6. Also, the other end of the seventh resistor R7 may be connected to one end of the eighth resistor R8.

The eighth resistor R8 may be configured to be located between the other end of the power source unit VCC and the other end of the fourth resistor R4. Specifically, the eighth resistor R8 may be configured such that one end is connected to the other end of the seventh resistor R7, and the other end is connected to the other end of the fourth resistor R4.

For example, in the embodiment of FIG. 2, the eighth resistor R8 may be located between the other end of the seventh resistor R7 and the other end of the negative electrode relay 30. Preferably, the eighth resistor R8 may be located between the other end of the seventh resistor R7 and the other end of the fourth resistor R4.

One end of the eighth resistor R8 may be connected to the other end of the seventh resistor R7. Also, the other end of the eighth resistor R8 may be connected to the other end of the negative electrode relay 30. That is, the other end of the eighth resistor R8 may be connected between the other end of the fourth resistor R4 and the other end of the negative electrode relay 30.

Also, at the ADC_H point between the seventh resistor R7 and the eighth resistor R8, the third voltage corresponding to the H node may be measured.

Additionally, the third resistor R3, the fifth resistor R5, the sixth resistor R6, the seventh resistor R7, the eighth resistor R8, and the fourth resistor R4 may form a closed circuit.

Figure 3:
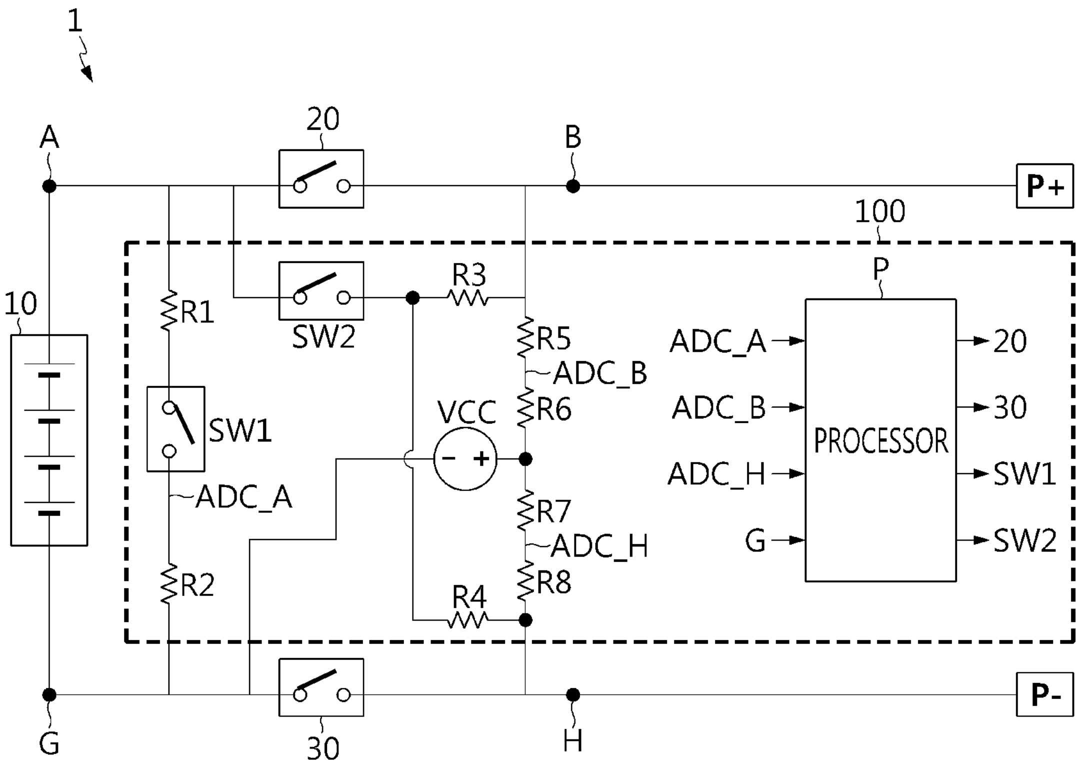
FIG. 3 is a diagram schematically showing an exemplary configuration of a battery pack according to another embodiment of the present disclosure.

FIG. 3 is a diagram schematically showing an exemplary configuration of a battery pack 1 according to another embodiment of the present disclosure.

Referring to FIG. 3, the relay diagnosis apparatus 100 may further include a processor P.

Here, the processor P may control the operation state of the positive electrode relay 20, the negative electrode relay 30, the first switch SW1, and the second switch SW2. Also, the processor P may measure the voltage at a designated point.

The processor P may be configured to measure the first voltage of the other end of the first switch SW1, measure the second voltage between the second switch SW2 and the other end of the power source unit VCC, and measure the third voltage between the other end of the power source unit VCC and the other end of the negative electrode relay 30.

For example, in the embodiment of FIG. 3, the processor P may measure the first voltage corresponding to the A node by measuring the voltage of the ADC_A point. Additionally, the processor P may measure the second voltage corresponding to the B node by measuring the voltage of the ADC_B point. Additionally, the processor P may measure the third voltage corresponding to the H node by measuring the voltage of the ADC_H point. Finally, the processor P may measure the ground voltage of the battery pack 1 by measuring the voltage of the G node. However, the processor P may receive information about the ground voltage of the battery pack 1 without directly measuring the voltage of the G node.

Below, an embodiment in which the processor P diagnoses the states of the positive electrode relay 20 and the negative electrode relay 30 will be described.

The processor P may be configured to calculate the voltage difference between the first voltage and the second voltage.

Specifically, the processor P may calculate the difference between the first voltage of the ADC_A point and the second voltage of the ADC_B point.

Figure 4:
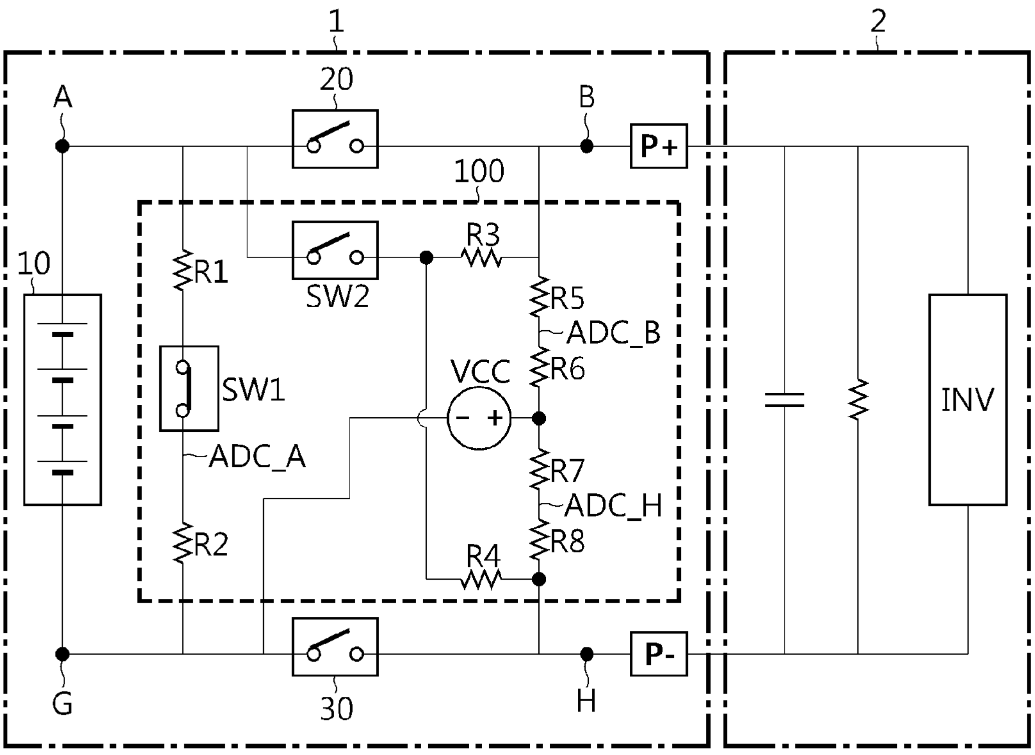
FIGS. 4 to 8 are diagrams schematically showing the operating configuration of the battery pack according to an embodiment of the present disclosure.

FIG. 4 is a diagram schematically showing the operating configuration of the battery pack 1 according to an embodiment of the present disclosure.

The processor P may be configured to measure the first voltage in a state where the operation states of the positive electrode relay 20, the negative electrode relay 30, and the second switch SW2 are controlled to a turn-off state, and the operation state of the first switch SW1 is controlled to a turn-on state.

For example, in the embodiment of FIG. 4, the processor P may control the operation state of the first switch SW1 to a turn-on state. In this case, the battery 10, the first resistor R1, the first switch SW1, and the second resistor R2 may be electrically connected. In addition, the processor P may control the operation state of the positive electrode relay 20, the negative electrode relay 30, and the second switch SW2 to a turn-off state. Additionally, the processor P may measure the voltage of the ADC_A point as the first voltage and the voltage of the ADC_B point as the second voltage.

The processor P may be configured to diagnose the state of the positive electrode relay 20 based on the calculated voltage difference.

For example, it is assumed that the state of the positive electrode relay 20 is normal. When the operation state of the positive electrode relay 20 is a turn-off state, the voltage difference between the first voltage and the second voltage may correspond to the voltage of the battery 10. Also, when the operation state of the positive electrode relay 20 is a turn-on state, the first voltage and the second voltage may correspond to the voltage of the battery 10.

On the other hand, it is assumed that the state of the positive electrode relay 20 is a fusion state. Because the contact point of the positive electrode relay 20 is fused, the positive electrode relay 20 may be maintained in the turn-on state even if the processor P attempts to control the positive electrode relay 20 to the turn-off state. In this case, the first voltage and the second voltage may correspond to the voltage of the battery 10. In other words, the processor P may diagnose the state of the positive electrode relay 20 based on the voltage difference between the first voltage and the second voltage.

Specifically, the processor P may diagnose the state of the positive electrode relay 20 according to the result of comparing the voltage difference between the first voltage and the second voltage with the voltage of the battery 10.

For example, if the voltage difference corresponds to the voltage of the battery 10, the processor P may diagnose the state of the positive electrode relay 20 as a normal state. That is, if the operation state of the positive electrode relay 20 is controlled to the turn-off state, the voltage difference may correspond to the voltage of the battery 10. Therefore, the processor P may diagnose the state of the positive electrode relay 20 as a normal state.

As another example, if the difference between the voltage difference and the voltage of the battery 10 is greater than or equal to a predetermined threshold, the processor P may diagnose the state of the positive electrode relay 20 as a fusion state. That is, when the operation state of the positive electrode relay 20 is maintained in the turn-on state (in the case of fusion state), the voltage difference may be close to 0 V. Therefore, the processor P may diagnose the state of positive electrode relay 20 as a fusion state.

The processor P may be configured to calculate the voltage difference between the third voltage and the ground voltage.

The processor P may be configured to measure the third voltage in a state in which the operation states of the positive electrode relay 20, the negative electrode relay 30, the first switch SW1, and the second switch SW2 are controlled to the turn-off state.

For example, the processor P may control the operation state of the positive electrode relay 20, the negative electrode relay 30, the first switch SW1, and the second switch SW2 to a turn-off state. Also, the processor P may measure the voltage of the ADC_H point as the third voltage. In the embodiment of FIG. 2, when the negative electrode relay 30 is normally controlled to the turn-off state, the third voltage may correspond to the voltage of the power source unit VCC.

The processor P may be configured to diagnose the state of the negative electrode relay 30 based on the calculated voltage difference.

For example, it is assumed that the state of the negative electrode relay 30 is normal. When the operation state of the negative electrode relay 30 is the turn-off state, the voltage difference between the third voltage and the ground voltage may correspond to the voltage of the power source unit VCC. Also, when the operation state of the negative electrode relay 30 is the turn-on state, the third voltage and the ground voltage may correspond to the voltage of the power source unit VCC.

On the other hand, it is assumed that the state of the negative electrode relay 30 is a fusion state. Because the contact point of the negative electrode relay 30 is fused, the negative electrode relay 30 may be maintained in the turn-on state even if the processor P attempts to control the negative electrode relay 30 to the turn-off state. In this case, the third voltage and the ground voltage may correspond to the voltage of the power source unit VCC. In other words, the processor P may diagnose the state of the negative electrode relay 30 based on the voltage difference between the third voltage and the ground voltage.

Specifically, the processor P may diagnose the state of the negative electrode relay 30 according to the result of comparing the voltage difference between the third voltage and the ground voltage and the voltage of the power source unit VCC.

For example, if the voltage difference corresponds to the voltage of the power source unit VCC, the processor P may diagnose the state of the negative electrode relay 30 as a normal state. That is, if the operation state of the negative electrode relay 30 is controlled to the turn-off state, the voltage difference may correspond to the voltage of the power source unit VCC. Therefore, the processor P may diagnose the state of the negative electrode relay 30 as a normal state.

As another example, if the difference between the voltage difference and the voltage of the power source unit VCC is greater than or equal to a predetermined threshold value, the processor P may diagnose the state of the negative electrode relay 30 as a fusion state. That is, when the operation state of the negative electrode relay 30 is maintained in the turn-on state (in the case of fusion state), the voltage difference may be close to 0 V. Therefore, the processor P may diagnose the state of the negative electrode relay 30 as a fusion state.

Below, embodiments of the second voltage and the third voltage according to the operation configuration of the battery pack 1 will be described. Specifically, when the voltage of the battery 10 is 800 [V], the measured second voltage and the measured third voltage for each operation state of the battery pack 1 are explained.

FIGS. 5 to 8 are diagrams schematically showing the operating configuration of the battery pack 1 according to an embodiment of the present disclosure.

Figure 5:
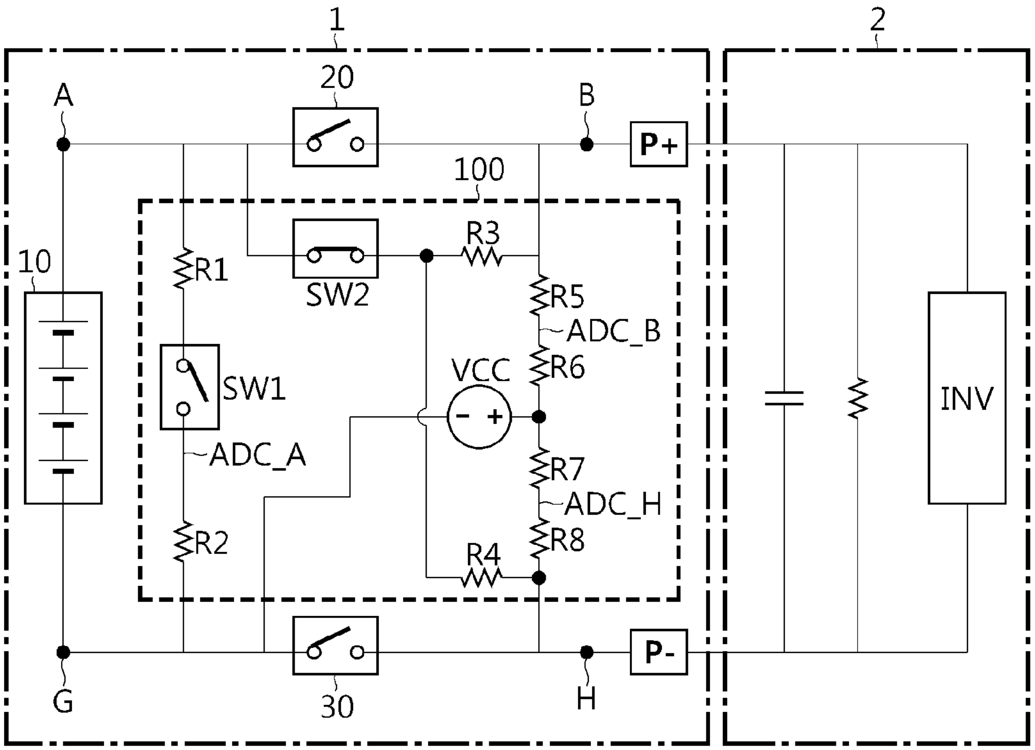

FIG. 5 shows an example in which the operation state of the second switch SW2 is controlled to a turn-on state in the embodiment of FIG. 2. The second voltage was measured as 399.5 [V], and the third voltage was measured as 399.5 [V].

Figure 6:
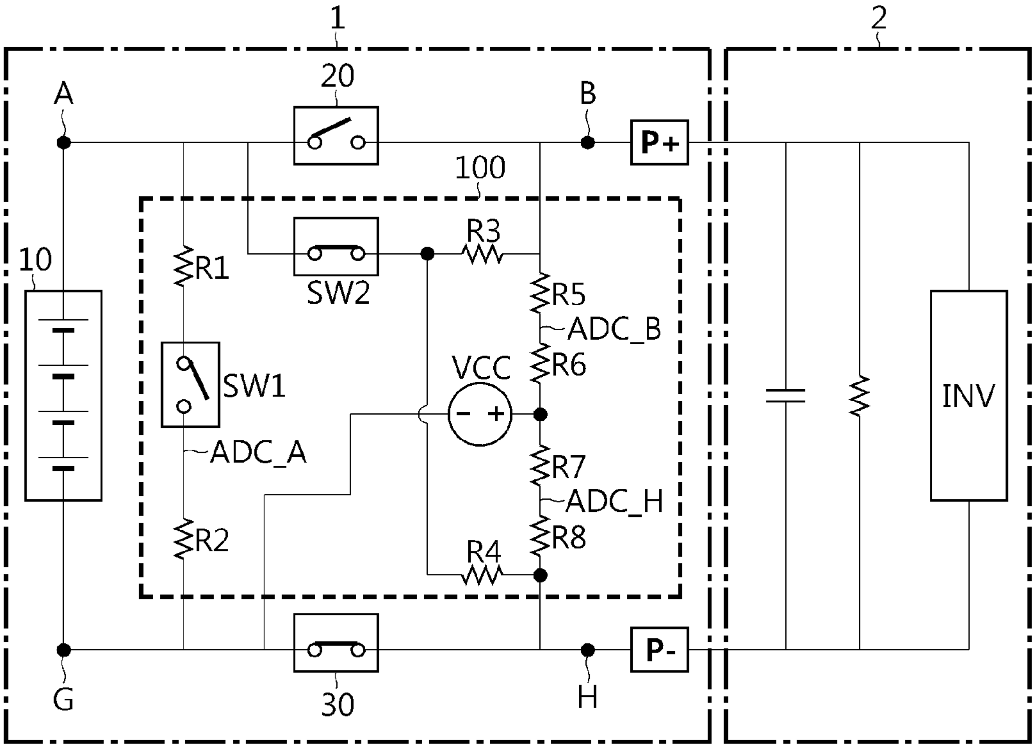

FIG. 6 shows an example in which the operation states of the second switch SW2 and the negative electrode relay 30 are controlled to a turn-on state in the embodiment of FIG. 2. The second voltage was measured as 399.5 [V], and the third voltage was measured as 1.2 [V].

Figure 7:
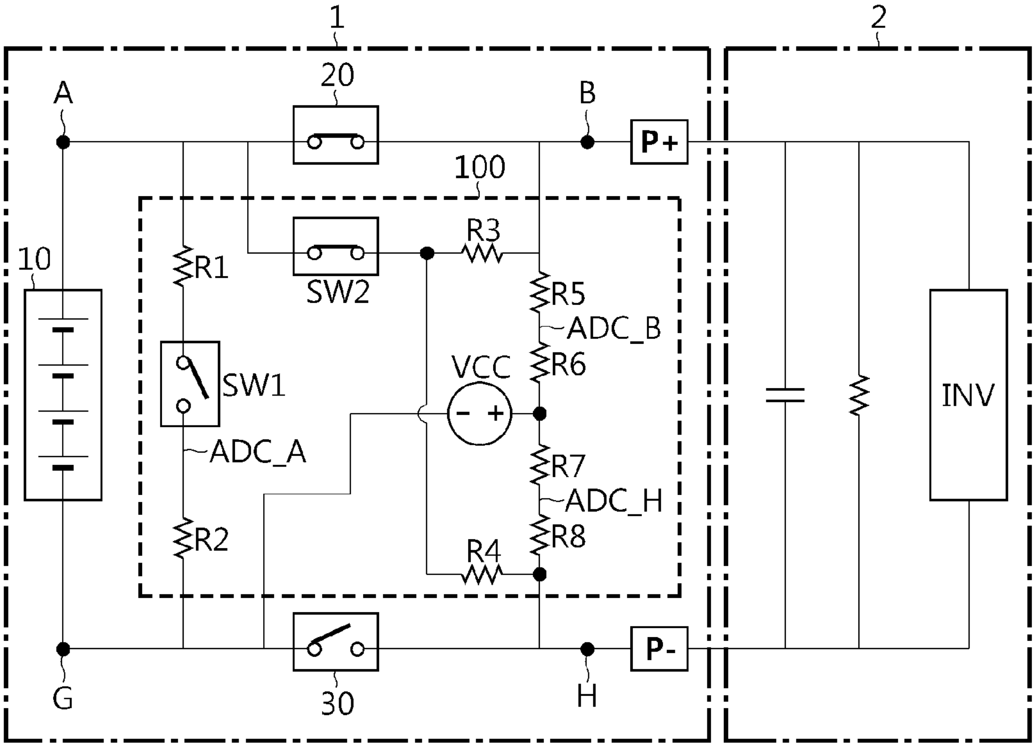

FIG. 7 shows an example in which the operation states of the second switch SW2 and the positive electrode relay 20 are controlled to a turn-on state in the embodiment of FIG. 2. The second voltage was measured as 799.7 [V], and the third voltage was measured as 399.5 [V].

Figure 8:
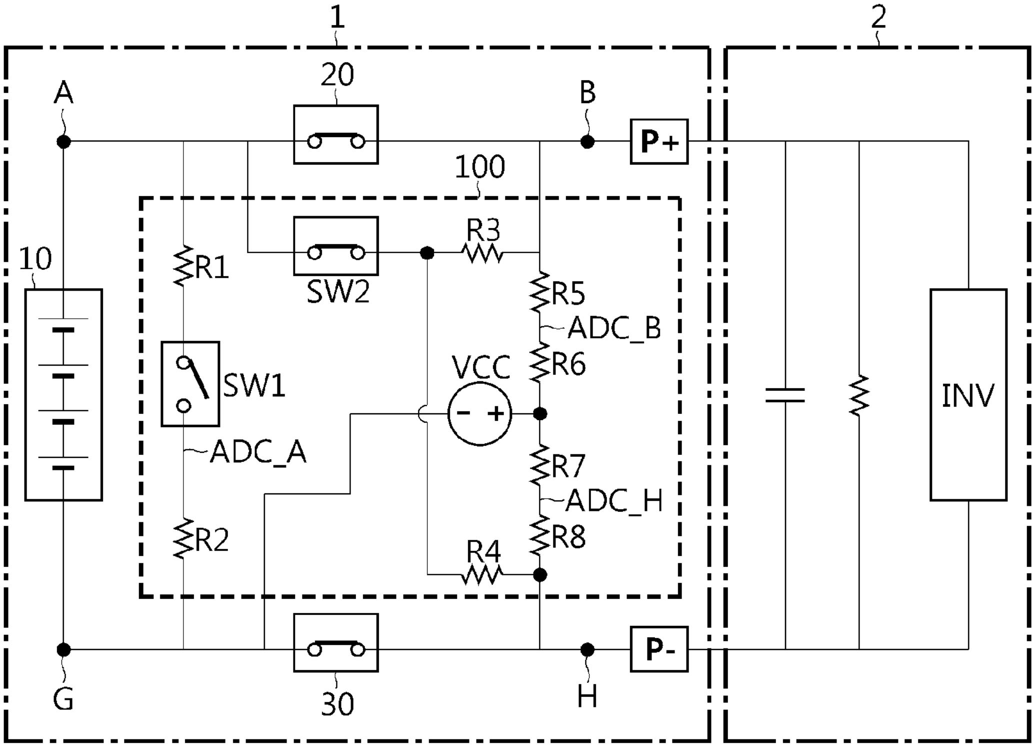

FIG. 8 shows an example in which the operation states of the second switch SW2, the positive electrode relay 20, and the negative electrode relay 30 are controlled to a turn-on state in the embodiment of FIG. 2. The second voltage was measured as 799.7 [V], and the third voltage was measured as 1.2 [V].

The present disclosure has the advantage of measuring the voltage of the ADC_B point and the ADC_H point connected to the second switch SW2 even in an environment where the positive electrode relay 20 and the negative electrode relay 30 are controlled to the turn-off state.

Meanwhile, the processor P according to the present disclosure may be applied to a BMS (Battery Management System). That is, the BMS according to the present disclosure may include the processor P described above. In this configuration, at least some of components of the processor P may be implemented by supplementing or adding functions of components included in a conventional BMS.

Figure 9:
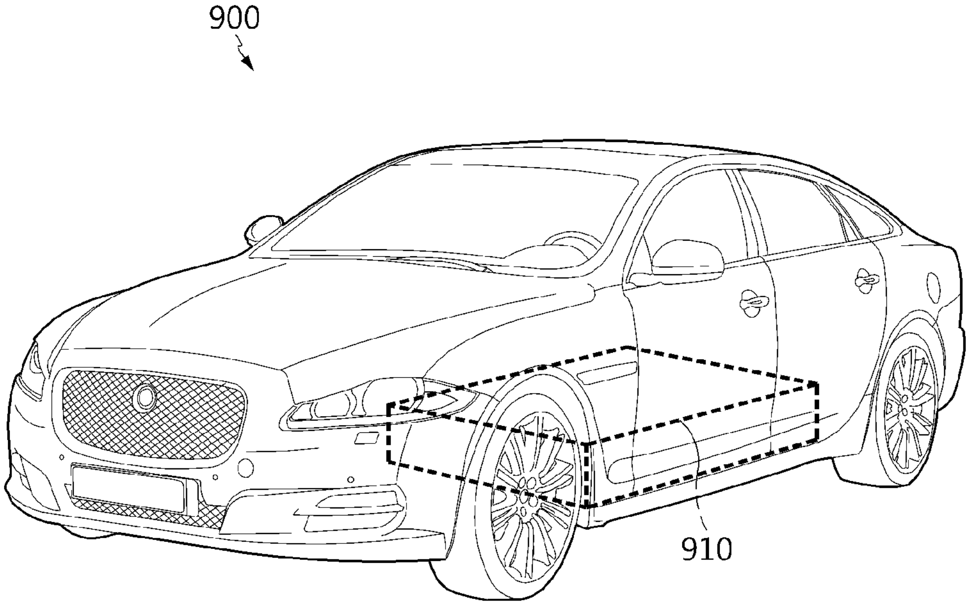
FIG. 9 is a drawing schematically showing a vehicle according to another embodiment of the present disclosure.

FIG. 9 is a drawing schematically showing a vehicle 900 according to another embodiment of the present disclosure.

Referring to FIG. 9, the battery pack 910 according to an embodiment of the present disclosure may be included in a vehicle 900 such as an electric vehicle (EV) or a hybrid vehicle (HV). Additionally, the battery pack 910 may drive the vehicle 900 by supplying power to the motor through an inverter provided in the vehicle 900.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery
20: positive electrode relay
30: negative electrode relay
100: relay diagnosis apparatus
SW1: first switch
SW2: second switch
R1-R8: first to eighth resistors
VCC: power source unit
P: processor

What is claimed is:

1. A relay diagnosis apparatus for diagnosing a positive electrode relay and a negative electrode relay provided in a battery pack, comprising:

a first switch, wherein a first end of the first switch is connected between a positive electrode of a battery and a first end of the positive electrode relay, and a second end of the first switch is connected between a negative electrode of the battery and a first end of the negative electrode relay;

a second switch, wherein a first end of the second switch is connected between the positive electrode of the battery and the first end of the positive electrode relay, and a second end of the second switch is connected between a second end of the positive electrode relay and a second end of the negative electrode relay; and a power source unit, wherein a first end of the power source unit is connected between the negative electrode of the battery and the first end of the negative electrode relay, and a second end of the power source unit is connected between the second end of the second switch and the second end of the negative electrode relay.

2. The relay diagnosis apparatus according to claim 1, further comprising:

a first resistor located between the positive electrode of the battery and the first end of the first switch, wherein a first end of the first resistor is connected to the positive electrode of the battery and a second end of the first resistor is connected to the first end of the first switch; and a second resistor located between the negative electrode of the battery and the second end of the first switch, wherein a first end of the second resistor is connected to the second end of the first switch and a second end of the second resistor is connected to the negative electrode of the battery.

3. The relay diagnosis apparatus according to claim 1, further comprising:

a third resistor located between the second end of the second switch and the second end of the positive electrode relay, wherein a first end of the third resistor is connected to the second end of the second switch and a second end of the third resistor is connected between the second end of the positive electrode relay and the second end of the power source unit; and a fourth resistor, wherein a first end of the fourth resistor is connected between the second end of the second switch and the first end of the third resistor, and a second end of the fourth resistor is connected between the second end of the power source unit and the second end of the negative electrode relay.

4. The relay diagnosis apparatus according to claim 3, further comprising:

a fifth resistor located between the second end of the third resistor and the second end of the power source unit, wherein a first end of the fifth resistor is connected between the second end of the third resistor and the second end of the positive electrode relay; and a sixth resistor located between the second end of the third resistor and the second end of the power source unit, wherein a first end of the sixth resistor is connected to the second end of the fifth resistor and the second end of the sixth resistor is connected to the second end of the power source unit.

5. The relay diagnosis apparatus according to claim 3, further comprising:

a seventh resistor located between the second end of the power source unit and the second end of the fourth resistor, wherein a first end of the seventh resistor is connected to the second end of the power source unit; and an eighth resistor located between the second end of the power source unit and the second end of the fourth resistor, wherein a first end of the eighth resistor is connected to the second end of the seventh resistor and the second end of the eighth resistor is connected to the second end of the fourth resistor.

6. The relay diagnosis apparatus according to claim 1, further comprising:

a processor configured to measure a first voltage of the second end of the first switch, measure a second voltage between the second switch and the second end of the power source unit, and measure a third voltage between the second end of the power source unit and the second end of the negative electrode relay.

7. The relay diagnosis apparatus according to claim 6, wherein the processor is configured to calculate a first voltage difference between the first voltage and the second voltage and diagnose a state of the positive electrode relay based on the calculated voltage difference.

8. The relay diagnosis apparatus according to claim 6, wherein the processor is configured to calculate a second voltage difference between the third voltage and a ground voltage and diagnose a state of the negative electrode relay based on the calculated voltage difference.

9. The relay diagnosis apparatus according to claim 6, wherein the processor is configured to measure the first voltage and the second voltage when the positive electrode relay, the negative electrode relay, and the second switch are in a turn-off state, and the first switch is in a turn-on state.

10. The relay diagnosis apparatus according to claim 6, wherein the processor is configured to measure the third voltage when the positive electrode relay, the negative electrode relay, the first switch, and the second switch are in a turn-off state.

11. A battery pack, comprising the relay diagnosis apparatus according to claim 1.

* * * * *